(12) United States Patent
Lee et al.

(10) Patent No.: US 9,263,709 B2
(45) Date of Patent: Feb. 16, 2016

(54) FLEXIBLE DISPLAY APPARATUS AND MANUFACTURING METHOD THEREOF

(71) Applicant: SAMSUNG DISPLAY CO., LTD., Yongin, Gyeonggi-do (KR)

(72) Inventors: Byung-Chul Lee, Yongin (KR); Dong-Sul Kim, Yongin (KR); Jin-Han Park, Yongin (KR); Hyung-Tag Lim, Yongin (KR); Hyun Choi, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 6 days.

(21) Appl. No.: 14/267,947

(22) Filed: May 2, 2014

(65) Prior Publication Data

US 2015/0076458 A1 Mar. 19, 2015

(30) Foreign Application Priority Data

Sep. 17, 2013 (KR) ........................ 10-2013-0111930

(51) Int. Cl.
*H01L 51/52* (2006.01)
*H01L 51/56* (2006.01)
*H01L 51/00* (2006.01)

(52) U.S. Cl.
CPC .............. *H01L 51/56* (2013.01); *H01L 51/003* (2013.01); *H01L 51/5256* (2013.01); *H01L 51/0097* (2013.01)

(58) Field of Classification Search
CPC . H01L 51/5253; H01L 51/56; H01L 51/5237; H01L 51/5256; H01L 51/50; H01L 2251/5338; H01L 51/5246; H01L 27/32; H01L 27/3206; H01L 27/3211; H01L 27/3223; H01L 27/3227; H01L 51/0097; H01L 21/56
See application file for complete search history.

(56) References Cited

U.S. PATENT DOCUMENTS

| | | | |
|---|---|---|---|
| 2005/0127371 A1* | 6/2005 | Yamazaki | H01L 27/3244 257/72 |
| 2008/0150419 A1 | 6/2008 | Kang | |
| 2010/0283056 A1* | 11/2010 | Yasumatsu | G02F 1/133305 257/59 |
| 2010/0308335 A1 | 12/2010 | Kim et al. | |
| 2011/0134018 A1* | 6/2011 | Seo | H01L 51/003 345/76 |
| 2012/0262660 A1* | 10/2012 | Fujiwara | G02F 1/1333 349/158 |
| 2012/0286312 A1 | 11/2012 | Hatano et al. | |

FOREIGN PATENT DOCUMENTS

| | | |
|---|---|---|
| KR | 10-2007-0063339 A | 6/2007 |
| KR | 10-2008-0057584 A | 6/2008 |
| KR | 10-2009-0065038 A | 6/2009 |
| KR | 10-2010-0118870 A | 11/2010 |

(Continued)

*Primary Examiner* — Evan Pert
*Assistant Examiner* — Leslie Pilar Cruz
(74) *Attorney, Agent, or Firm* — Lee & Morse, P.C.

(57) ABSTRACT

A method of manufacturing a flexible display apparatus includes sequentially forming a flexible substrate, a thin film transistor (TFT), an organic light-emitting diode (OLED) including a first electrode, an intermediate layer, and a second electrode, and a first attachment layer on a carrier substrate, sequentially forming a deposition layer and a second attachment layer on a sealing film, attaching the carrier substrate and the sealing film to each other such that the sealing film covers flexible substrate on the carrier substrate, sealing the first and second attachment layers, laminating the carrier substrate and the sealing film, and separating the sealing film and the flexible substrate from the carrier substrate.

13 Claims, 14 Drawing Sheets

(56) References Cited

FOREIGN PATENT DOCUMENTS

| KR | 10-2010-0130898 A | 12/2010 |
| KR | 10-2012-0127236 A | 11/2012 |
| KR | 10-2013-0043929 A | 5/2013 |

* cited by examiner

FLEXIBLE DISPLAY APPARATUS AND MANUFACTURING METHOD THEREOF

CROSS-REFERENCE TO RELATED APPLICATION

Korean Patent Application No. 10-2013-0111930, filed on Sep. 17, 2013, in the Korean Intellectual Property Office, and entitled: "Flexible Display Apparatus and Manufacturing Method Thereof," is incorporated by reference herein in its entirety.

BACKGROUND

1. Field

Embodiments relate to a flexible display apparatus and a manufacturing method thereof.

2. Description of the Related Art

In general, an organic light-emitting display apparatus that includes a thin film transistor (TFT) may be applied as a display apparatus in mobile devices, such as smartphones, digital cameras, video cameras, camcorders, personal digital assistants (PDAs), ultra slim laptops, and tablet personal computers (PCs), or in electronic devices, such as ultra slim TVs and flexible display apparatuses.

The organic light-emitting display apparatus includes a first electrode, a second electrode, and an intermediate layer disposed between the first and second electrodes. The organic light-emitting display apparatuses provide high-quality features such as wide viewing angles, high contrast ratio, and quick response times.

SUMMARY

Embodiments are directed to a method of manufacturing a flexible display apparatus including sequentially forming a flexible substrate, a thin film transistor (TFT), an organic light-emitting diode (OLED) including a first electrode, an intermediate layer, and a second electrode, and a first attachment layer on a carrier substrate, sequentially forming a deposition layer and a second attachment layer on a sealing film, attaching the carrier substrate and the sealing film to each other such that the sealing film covers flexible substrate on the carrier substrate, sealing the first and second attachment layers, laminating the carrier substrate and the sealing film, and separating the sealing film and the flexible substrate from the carrier substrate.

Forming the flexible substrate on the carrier substrate may include forming the flexible substrate by coating a polymer material on an entire surface of the carrier substrate.

Forming the first attachment layer may include forming the first attachment layer as an uppermost layer of a sub-pixel that is defined on the flexible substrate.

The first attachment layer may be formed on the second electrode and around the sub-pixel.

The first attachment layer may be formed in a shape of a line that continues in at least one direction around the sub-pixel.

The first attachment layer may be formed to surround the sub-pixel.

A plurality of sub-pixels may be grouped on the substrate. The first attachment layer may be formed between each group.

The first attachment layer may be formed as an individual bar in at least one direction around the sub-pixel.

The second electrode may be formed in an entire area of the flexible substrate. The first attachment layer may include the second electrode.

The first attachment layer may include at least one of a metal layer, an inorganic layer, and a laser reactive layer.

Forming the deposition layer on the sealing film may include depositing at least one layer of an inorganic layer and at least one layer of an organic layer on a surface of the sealing film facing the carrier substrate.

The second attachment layer may be formed in an entire area of the deposition layer.

The second attachment layer may include at least one of a metal layer, an inorganic layer, and a laser reactive layer.

Sealing the first and second attachment layers may include laser-sealing and heat-bonding the first and second attachment layers at a predetermined position.

Separating the sealing film and the flexible substrate from the carrier substrate may include irradiating a laser beam from an outside of the carrier substrate, such that a structure including the flexible substrate, the TFT, the OLED including the first electrode, the intermediate layer, and the second electrode, and the first attachment layer is separated from the carrier substrate.

The flexible substrate may be a flexible mother substrate having a size in which a plurality of individual display apparatus units may be formed. The TFT and the OLED may be formed on each of separate regions of the flexible substrate. After separating the sealing film from the carrier substrate, cutting the flexible substrate into the plurality of individual display apparatus units.

The method may further include spreading an ultraviolet (UV) sealant along an edge of the flexible substrate, and curing the ultraviolet (UV) sealant.

Embodiments are also directed to a flexible display apparatus including a flexible substrate, at least one thin film transistor (TFT) formed on the flexible substrate, an organic light-emitting diode (OLED) that is electrically connected to the TFT and includes a first electrode, an intermediate layer including an organic emission layer, and a second electrode, and a sealing film that is formed on the flexible substrate, the sealing film including a deposition layer covering the OLED. A first attachment layer and a second attachment layer for heat-bonding the flexible substrate and the sealing film, may be respectively located on respective surfaces of the flexible substrate and the sealing film that face each other.

The first attachment layer may be an uppermost layer of a sub-pixel that is defined on the flexible substrate. The second attachment layer may be on a surface of the sealing film that faces the flexible substrate.

The first attachment layer may be on the second electrode and around the sub-pixel. The second attachment layer may be in a region of the sealing film which corresponds to the first attachment layer.

The first attachment layer may be in a shape of a line that continues in at least one direction around the sub-pixel.

The first attachment layer may be an individual bar, in at least one direction around the sub-pixel.

The second electrode may be in an entire area of the flexible substrate. The first attachment layer may include the second electrode.

The first attachment layer and the second attachment layer may include at least one of a metal layer, an inorganic layer, and a laser reactive layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
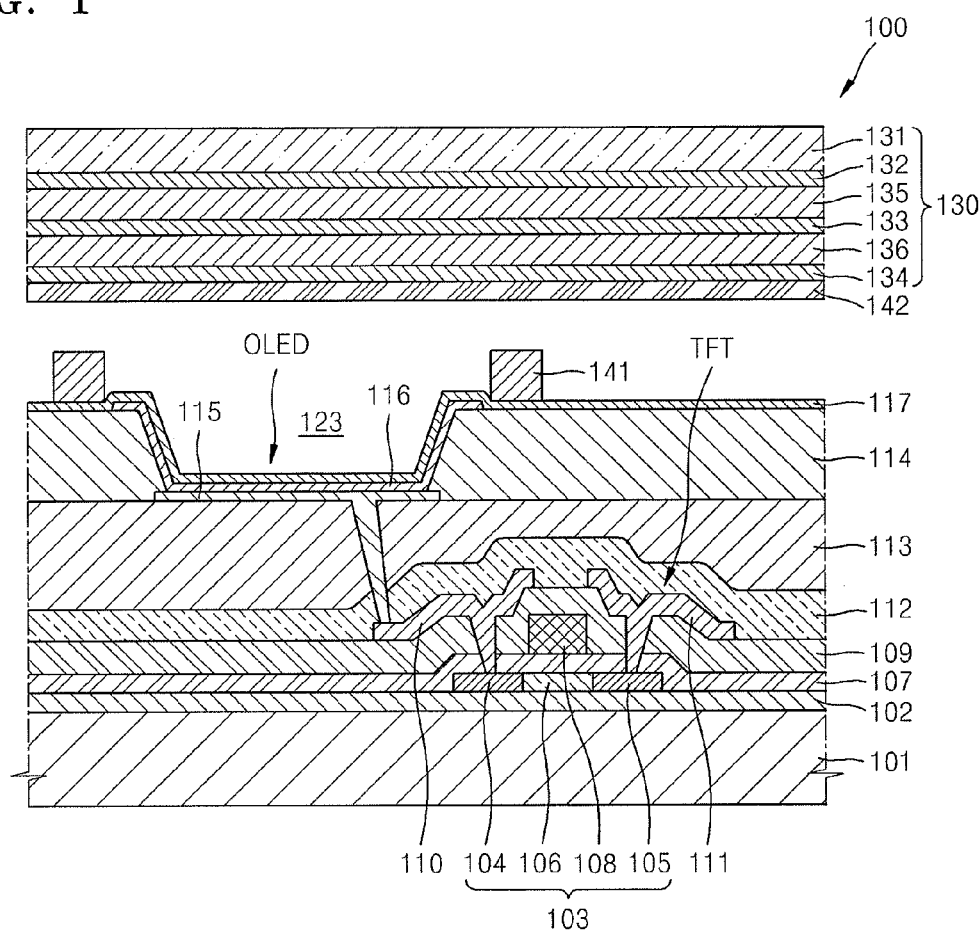
FIG. 1 illustrates a cross-sectional view depicting a sub-pixel of an organic light-emitting display apparatus, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, expressions such as "at least one of," when preceding a list of elements, modify the entire list of elements and do not modify the individual elements of the list. It is to be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "comprising" used herein specify the presence of stated features, numbers, processes, operations, components, elements, or a combination thereof, but do not preclude the presence or addition of one or more other features, numbers, processes, operations, components, elements, or a combination thereof.

Figure 2:
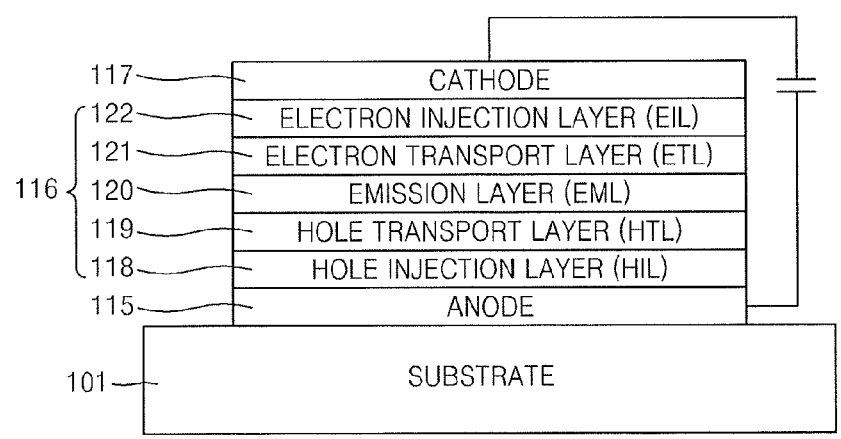
FIG. 2 illustrates a structural view schematically depicting an organic light-emitting diode (OLED) of FIG. 1.

FIG. 1 illustrates a cross-sectional view depicting a sub-pixel of an organic light-emitting display apparatus 100, according to an embodiment. FIG. 2 illustrates a structural view schematically depicting an organic light-emitting diode (OLED) of FIG. 1.

The sub-pixel includes at least one thin film transistor (TFT), and the OLED. A structure of the TFT may be modified in various ways.

Hereinafter, an example in which the organic light-emitting display apparatus 100 is applied to a flexible display apparatus will be described.

Referring to FIGS. 1 and 2, a flexible substrate 101 is provided in the organic light-emitting display apparatus 100. The flexible substrate 101 may be formed by using a flexible and insulative material. For example, the flexible substrate 101 may be formed of a suitable polymer material such as polyimide (PI), polycarbonate (PC), polyethersulfone (PES), polyethylene terephthalate (PET), polyethylenenaphthalate (PEN), polyarylate (PAR), or fiber glass reinforced plastic (FRP).

The flexible substrate 101 may be transparent, translucent, or opaque.

A barrier layer 102 may be formed on the flexible substrate 101. The barrier layer 102 may completely cover an upper surface of the flexible substrate 101. The barrier layer 102 may include an inorganic layer or an organic layer.

For example, the barrier layer 102 may be formed of an inorganic material such as silicon oxide ($SiO_x$), silicon nitride ($SiN_x$), silicon oxynitride (SiON), aluminum oxide (AlO), or aluminum nitride (AlON); or an organic material such as acryl, PI, or polyester. The barrier layer 102 may be stacked as a single layer or a multi-layer.

The barrier layer 102 may block oxygen and moisture, may prevent moisture or impurities from spreading from the flexible substrate 101, and may provides a flat surface on an upper portion of the flexible substrate 101.

The TFT may be formed on the barrier layer 102. The TFT according to the present embodiment may be a top-gate type. In other implementations, the TFT may be a bottom-gate type or another type of TFT.

A semiconductor active layer 103 may be formed on the barrier layer 102. The semiconductor active layer 103 may be doped with n-type or p-type impurity ions, and thus, a source area 104 and a drain area 105 may be formed in the semiconductor active layer 103. An area between the source and drain areas 104 and 105 may be a channel area 106 that is not doped with impurities.

When the semiconductor active layer 103 is formed of polysilicon, amorphous silicon may be formed first and then crystallized. Thus, the amorphous silicon may be converted to polysilicon.

A method of crystallizing the amorphous silicon may be a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or the like.

In order to use the flexible substrate 101 according to the present embodiment, a method in which a high-temperature heating process is not necessary may be used. For example, when crystallizing by using a low temperature polysilicon (LTPS) process, a laser beam may be irradiated for a short time so as to activate the semiconductor active layer 103. An exposure time of the flexible substrate 101 to high temperature, for example, a temperature of 450° C. or above, may be reduced. Therefore, the TFT may be formed on the flexible substrate 101 including a polymer material.

In other implementations, the semiconductor active layer 103 may be formed of an oxide semiconductor.

For example, the oxide semiconductor may include a metal element in Groups 12 to 14, such as zinc (Zn), indium (In), gallium (Ga), tin (Sn), cadmium (Cd), germanium (Ge), hafnium (Hf), or an oxide of a material selected from a combination thereof.

A gate insulating layer 107 may be deposited on the semiconductor active layer 103. The gate insulating layer 107 may be formed as a single layer or multi-layer formed of an inorganic layer $SiO_2$, $SiN_x$, or metal oxide.

A gate electrode 108 may be formed in a predetermined region of the gate insulating layer 107. The gate electrode 108 may be electrically connected to a gate line by which an ON or OFF signal of the TFT is applied. The gate electrode 108 may be formed as a single layer including gold (Au), silver (Ag), copper (Cu), nickel (Ni), platinum (Pt), palladium (Pd), Al, molybdenum (Mo), chromium (Cr), or may be formed as a multi-layer including a combination thereof or an alloy such as Al:Nd, and Mo:W.

An interlayer insulating layer 109 may be formed on the gate electrode 108. The interlayer insulating layer 109 may be formed of an insulative material, such as $SiO_2$ or $SiN_x$, or an insulative organic material.

A source electrode 110 and a drain electrode 111 may be formed on the interlayer insulating layer 109. A contact hole may be formed by selectively removing the gate insulating layer 107 and the interlayer insulating layer 109. The source electrode 110 may be electrically connected to the source area 104 via the contact hole, and the drain electrode 111 may be electrically connected to the drain area 105 via another contact hole.

A passivation layer 112 may be formed on the source and drain electrodes 110 and 111. The passivation layer 112 may be formed of an insulative material, such as $SiO_2$ or $SiN_x$, or an insulative organic material.

A planarization layer 113 may be formed on the passivation layer 112. The planarization layer 113 may include an organic material such as acryl, PI, or benzocyclobutene (BCB).

The OLED may be formed on an upper portion of the TFT.

In order to form the OLED, a first electrode 115 may be connected to either one of the source electrode 110 and the drain electrode 111 via a contact hole. The first electrode 115 corresponds to a pixel electrode.

Among electrodes included in the OLED, the first electrode 115 may function as an anode, and may be formed of various conductive materials. The first electrode 115 may be formed as a transparent electrode or a reflective electrode, according to circumstances.

For example, when the first electrode 115 is formed as a transparent electrode, the first electrode 115 may include indium tin oxide (ITO), indium zinc oxide (IZO), zinc oxide (ZnO), or indium oxide ($In_2O_3$). When the first electrode 515 is formed as a reflective electrode, a reflective layer may be formed by using Ag, magnesium (Mg), aluminum (Al), Pt, Pd, Au, Ni, neodymium (Nd), iridium (Ir), Cr, or a compound thereof, and then, ITO, IZO, ZnO, or $In_2O_3$ may be formed on the reflective layer.

A pixel-defining layer (PDL) 114 may be formed such that the PDL 114 is provided on the planarization layer 113 and covers an edge of the first electrode 115 of the OLED. The PDL 114 may define respective light-emission areas of each sub-pixel by surrounding the edge of the first electrode 115.

The PDL 114 may be formed of an organic material or an inorganic material.

For example, the PDL 114 may be formed of an organic material, such as PI, polyamide, BCB, acrylic resin, or phenol resin; or an inorganic material such as $SiN_x$. The PDL 514 may be formed as a single layer or a multi-layer, and may be modified in various ways.

An intermediate layer 116 may be formed on the first electrode 115 that is externally exposed by etching a portion of the PDL 114. The intermediate layer 116 may be formed by using a deposition process.

In the present embodiment, the intermediate layer 116 is illustrated as being patterned such that the intermediate layer 116 only corresponds to the sub-pixel, that is, the first electrode 115 that is patterned. However, the illustration is only for convenience of description to describe a configuration of the sub-pixel. In other implementations, the intermediate layer 116 may be modified in various ways.

The intermediate layer 116 may be formed of a low-molecular weight organic material or a polymer organic material.

As illustrated in FIG. 2, when the intermediate layer 116 is formed of a low-molecular weight organic material, the intermediate layer 516 may include an organic emission layer (EML; 120). In other implementations, the intermediate layer 516 may include the EML, and at least one of a hole injection layer (HIL; 118), a hole transport layer (HTL; 119), an electron transport layer (ETL; 121), and an electron injection layer (EIL; 122). The intermediate layer 116 may further include the EML and other various functional layers.

When the intermediate layer 116 is formed of a polymer organic material, the intermediate layer 116 may include an HTL and an EML. The polymer organic material may be formed by using a screen printing method or an inkjet printing method.

Referring back to FIG. 1, a second electrode 117, which corresponds to a common electrode of the OLED, may be formed on the intermediate layer 116. Like the first electrode 115, the second electrode 117 may be formed as a transparent electrode or a reflective electrode.

The first and second electrodes 115 and 117 may be insulated by the intermediate layer 116. When a voltage is applied to the first and second electrodes 115 and 117, the intermediate layer 116 may emit visible light, and thus an image that is recognizable by a user may be displayed.

When the second electrode 117 is formed as a transparent electrode, a metal having a low work function, such as lithium (Li), calcium (Ca), LiF/Ca, LiF/Al, Al, Mg, or a compound thereof, may be deposited on the intermediate layer 116. Then, an auxiliary electrode, which is formed of a material for forming a transparent electrode, such as ITO, IZO, ZnO, or $In_2O_3$, may be formed on the metal.

When the second electrode 117 is formed as a reflective electrode, the second electrode 117 may be formed by depositing Li, Ca, LiF/Ca, LiF/Al, Al, Mg, or a compound thereof on the entire area of the organic light-emitting display apparatus 100.

When the first electrode 115 is formed as a transparent electrode or a reflective electrode, the first electrode 115 may be formed such that a shape of the first electrode 115 corresponds to respective openings of sub-pixels. The second electrode 117 may be formed by depositing a transparent electrode or a reflective electrode on an entire display area of the organic light-emitting display apparatus 100. In other implementations, the second electrode 117 may not be deposited on the entire display area, but may be formed to have various patterns. In addition, the first and second electrodes 115 and 117 may be stacked at positions opposite to each other.

A sealing film 130 may be formed on an upper portion of the OLED so as to protect the intermediate layer 116 and other thin films from external moisture or oxygen.

The sealing film 130 may include a base film 131. The base film 131 may include polyethylene naphthalate (PEN), polyethylene terephthalate (PET), polycarbonate (PC), polyethersulfone (PES), transparent PI, polyarylate (PAR), polycyclic olefin (PCO), cross-linkable epoxy, a cross-linkable urethane film, or the like.

At least one layer of an inorganic layer and at least one layer of an organic layer may be stacked on a surface of the base film 131. In the present embodiment, an inorganic layer including a first inorganic layer 132, a second inorganic layer 133, and a third inorganic layer 134; and an organic layer including a first organic layer 135 and a second organic layer 136 may be alternately stacked.

The first, second, and third inorganic layers 132, 133, and 134 may include $SiO_2$, $SiN_x$, aluminum oxide ($Al_2O_3$), titanium oxide ($TiO_2$), zirconium oxide ($ZrO_x$), ZnO, or the like.

The first inorganic layer 135 or the second inorganic layer 136 may include epoxy, PI, PET, PC, polyethylene, polyacrylate, or the like.

The sealing film 130 may include at least one layer of first and second organic layers 135 and 136, and at least two layers of first, second, and third inorganic layers 132, 133, and 134.

Attachment layers, which are used as a medium for heat-bonding the flexible substrate 101 and the sealing film 130, may be provided on respective surfaces of the flexible substrate 101 and the sealing film 130 that face each other. A first attachment layer 141 may be formed on the flexible substrate 101, and a second attachment layer 142 is formed on the sealing film 130.

FIGS. 3A to 3I illustrate views depicting stages of a process of forming thin films on the flexible substrate 101 of the organic light-emitting display apparatus 100 of FIG. 1. FIGS. 4A to 4F illustrate views depicting stages of a process of forming the sealing film 130 of the organic light-emitting display apparatus 100 of FIG. 1. FIGS. 5A to 5D illustrate views depicting stages a process of attaching the flexible substrate 101 and the sealing film 130. FIG. 6 illustrates a flowchart depicting a process of manufacturing the organic light-emitting display apparatus 100 of FIG. 1.

The term "organic light-emitting display apparatus 100" may refer to an individual unit of a display apparatus. A manufacturing process described below may provide a process of manufacturing a plurality of units of the organic light-emitting display apparatus 100 on a single carrier substrate.

Referring to FIGS. 3A to 3I and FIG. 6, a process of forming the plurality of thin films on the flexible substrate 101 of the organic light-emitting display apparatus 100 of FIG. 1 will be described below.

Figure 3A:
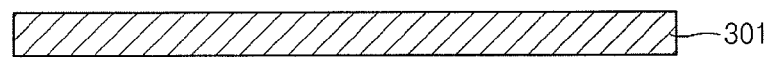
FIGS. 3A to 3I illustrate views depicting stages of a process of forming a plurality of thin films on a flexible substrate of the organic light-emitting display apparatus of FIG. 1.

As illustrated in FIG. 3A, a carrier substrate 301 may be supplied (operation S10).

The organic light-emitting display apparatus 100 may be formed of a flexible material. If heat of a predetermined temperature were applied to a flexible, unsupported organic light-emitting display apparatus 100, the flexible unsupported organic light-emitting display apparatus could bend or stretch, and, it could be difficult to accurately form thin film patterns, such as various electrodes and conductive wires, on the flexible substrate 101. Thus, a rigid substrate, for example, the carrier substrate 301, which may be formed of a thick glass film, may be used as a supporting substrate during the forming of the organic light-emitting display apparatus 100.

Figure 3B:
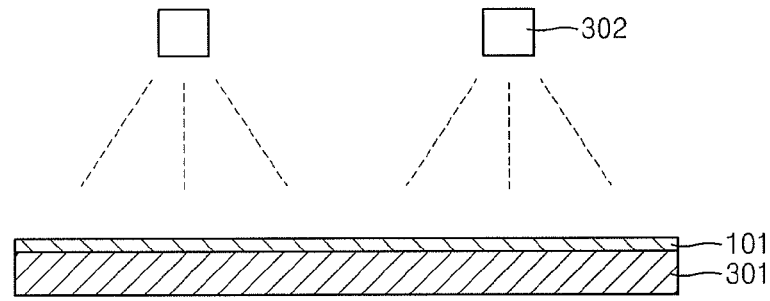

As illustrated in FIG. 3B, the flexible substrate 101 may be formed on the carrier substrate 301 (operation S20).

On the carrier substrate 301, the flexible substrate 101 may cover an area where the individual units of the organic light-emitting display apparatus 100 are to be formed. The flexible substrate 101 may be formed by using a flexible polymer material.

For example, the flexible substrate 101 may be formed of a polymer material such as PI, PC, PES, PET, PEN, PAR, or FRP.

A spray device 302 may be provided such that the spray device 302 is spaced apart from an upper surface of the carrier substrate 301. The spray device 302 may spray a polymer material onto the flexible substrate 101. The polymer material may be coated onto the carrier substrate 301 by using the spray device 302. The polymer material may be coated entirely on the carrier substrate 301.

When the coating is finished, the flexible substrate 101, formed as a thin film, may be completely formed by curing the polymer material. A curing method may be a heat curing method, an ultraviolet (UV) curing method, or an electron beam curing method. In other implementations, the flexible substrate 101 may be formed by laminating a polymer film on the carrier substrate 301.

The formed flexible substrate 101 may be transparent, translucent, or opaque.

Figure 3C:
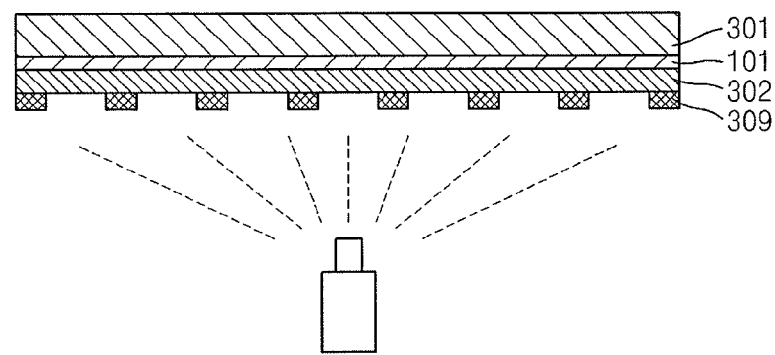

As illustrated in FIG. 3C, a TFT 302 may be formed on the flexible substrate 101 (operation S30).

As illustrated in FIG. 1, the TFT 302 includes the plurality of thin films that are formed on the flexible substrate 101. Masks 309 may be selectively provided on the flexible substrate 101 so as to pattern each of the thin films.

The barrier layer 102, the semiconductor active layer 103, the gate the insulating layer 107, the gate electrode 108, the interlayer insulating layer 109, the source electrode 110, the drain electrode 111, the passivation layer 112, and the planarization layer 113 may be formed on the flexible substrate 101. Also, at least one capacitor, and various wires may be formed by using various methods, such as chemical vapor deposition (CVD), plasma enhanced chemical vapor deposition (PECVD), or atomic layer deposition (ALD).

On the planarization layer 113, the first electrode 115 of the OLED may be patterned, and then, the PDL 114 may be formed to cover the edge of the first electrode 115.

Figure 3D:
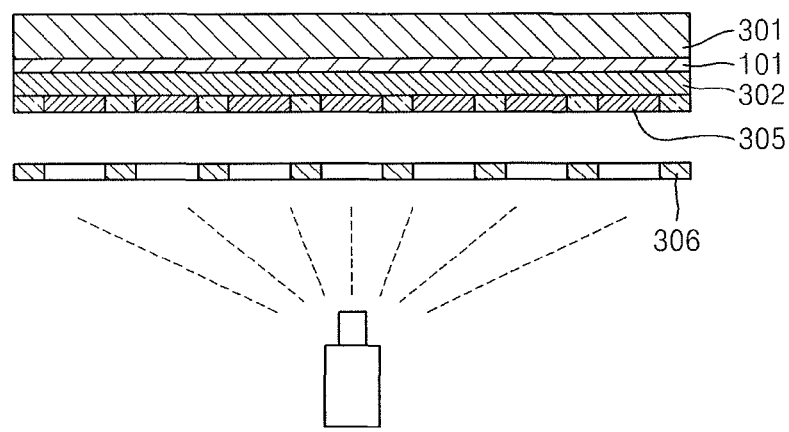

As illustrated in FIG. 3D, an OLED 305 may be formed on the TFT 302 (operation S40).

As illustrated in FIG. 1, the intermediate layer 116 may be deposited in a sub-pixel area defined by the PDL 114. In this case, the organic EML 120 provided in the intermediate layer 116 may be formed by using masks 306, and may be deposited in each sub-pixel area with corresponding colors. The organic EML 120 may be deposited on an upper surface of the first electrode 115.

The HIL 118, the HTL 119, the ETL 121, and the EIL 122 provided in the intermediate layer 116 may be formed in the entire area of the organic light-emitting display apparatus 100, without a separate pattern mask.

After the intermediate layer 116 is formed, the second electrode 117 may be formed on an upper surface of the intermediate layer 116. The second electrode 117 may be deposited in the entire area of the organic light-emitting display apparatus 100. Thus, the OLED 305 may be formed on the TFT 302.

Figure 3E:
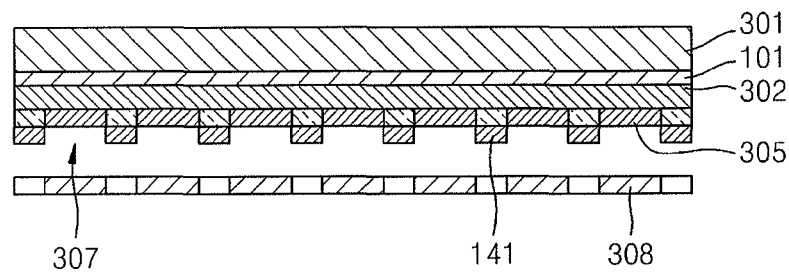

As illustrated in FIG. 3E, the first attachment layer 141 is formed on the OLED 305 (operation S50).

The first attachment layer 141 may be formed as the uppermost layer of a region 307 in which the sub-pixels are formed. The region 307 may be defined on the flexible substrate 101. According to the present embodiment, the first attachment layer 141 is formed on the second electrode 117 and around the sub-pixels. To form the first attachment layer 141, a pattern mask 308 may be provided on the flexible substrate 101, and a material for the first attachment layer 141 may be coated on an upper surface of the region 307.

Figure 3F:
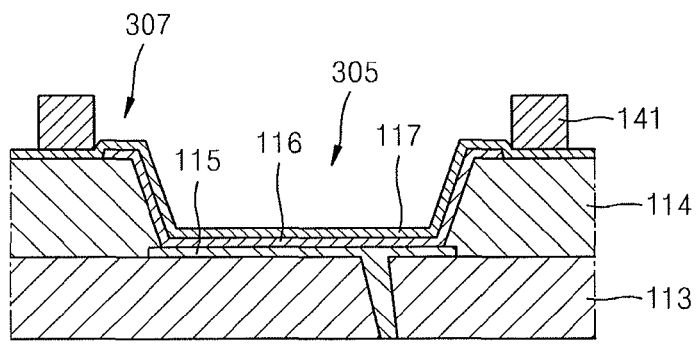

As illustrated in FIG. 3F, the OLED 305 that includes the first electrode 115, the intermediate layer 116, and the second electrode 117 may be formed on the flexible substrate 101. As described above, on the flexible substrate 101, the sub-pixel is defined by an opening that is formed by etching a portion of the PDL 114. The first electrode 115 may be externally exposed in the sub-pixel. The intermediate layer 116 that emits various colors may be formed on the upper surface of the first electrode 115. The second electrode 117 may be formed on the upper surface of the intermediate layer 116, and may cover the PDL 114.

The first attachment layer 141 may be formed on the second electrode 117 and around the sub-pixel. The first attachment layer 141 may be patterned in various ways.

For example, the first attachment layer 141 may be formed as a line that continues in at least one direction around or adjacent to the sub-pixel.

Figure 3G:
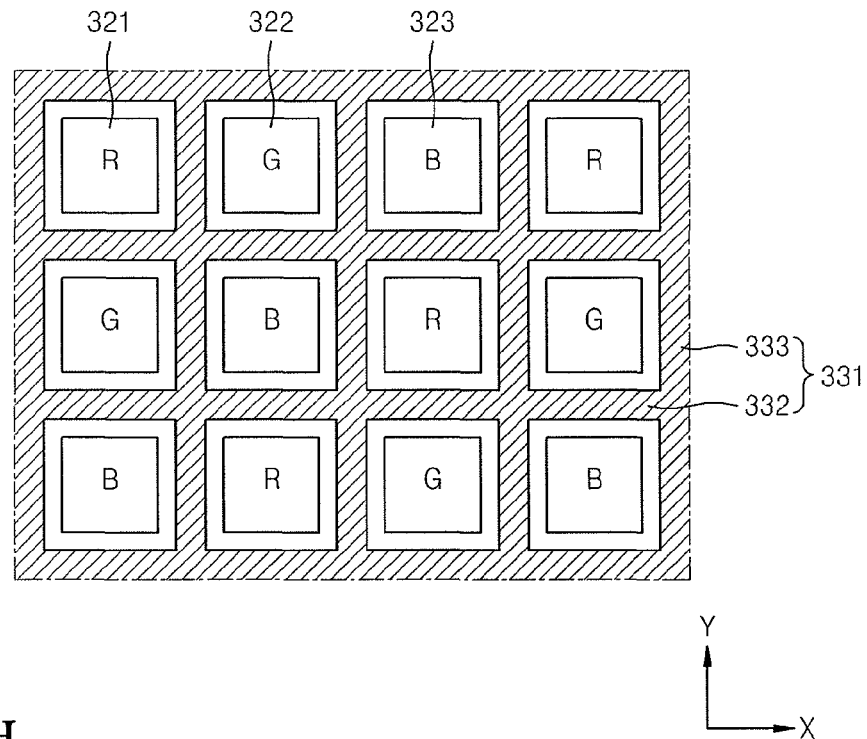

For example, as illustrated in FIG. 3G, an attachment layer 331 may be formed around a red sub-pixel 321, a green sub-pixel 322, and a blue sub-pixel 323. The attachment layer 331 may include a first attachment layer 332 that is provided between adjacent sub-pixels and extends in an X-direction. A second attachment layer 333, connected to the first attachment layer 332, may be provided between the adjacent sub-pixels and may extend in a Y-direction. The first and second attachment layers 332 and 333 may be formed as stripes. The first and second attachment layers 332 and 333 may be connected to each other and form a quadrangle that surrounds the sub-pixels.

Figure 3H:
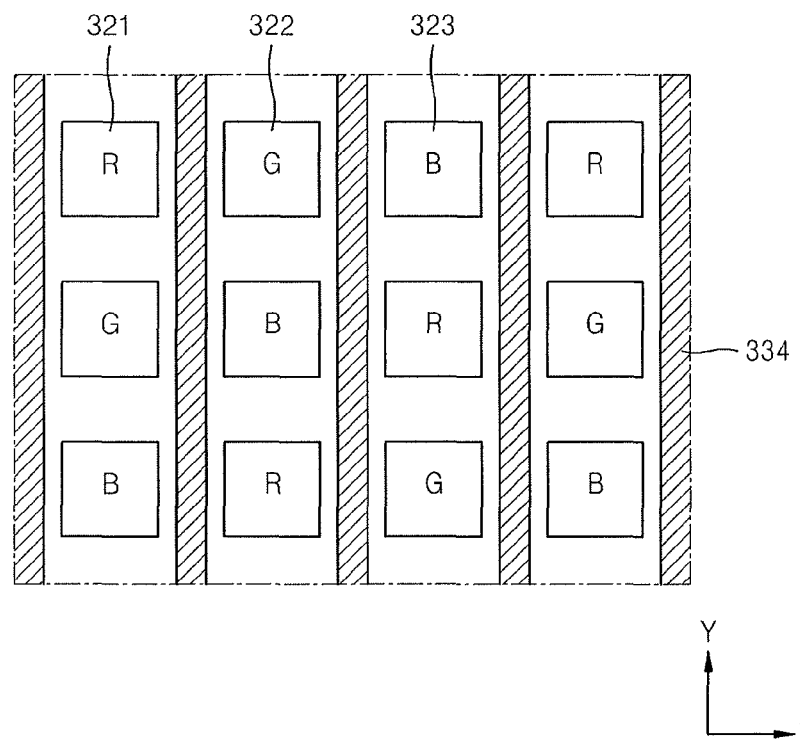

As illustrated in FIG. 3H, an attachment layer 334 may be provided between the red, green, and blue sub-pixels 321, 322, and 323 and may extend in a direction (for example, a Y-direction). The attachment layer 334 may be formed as a stripe. The attachment layer 334 may be formed in a direction of the flexible substrate 101, along an array of the red, green, and blue sub-pixels 321, 322, and 323.

In other implementations, an attachment layer may be formed as an individual bar or spot, in at least one direction around or adjacent to the sub-pixel.

Figure 3I:
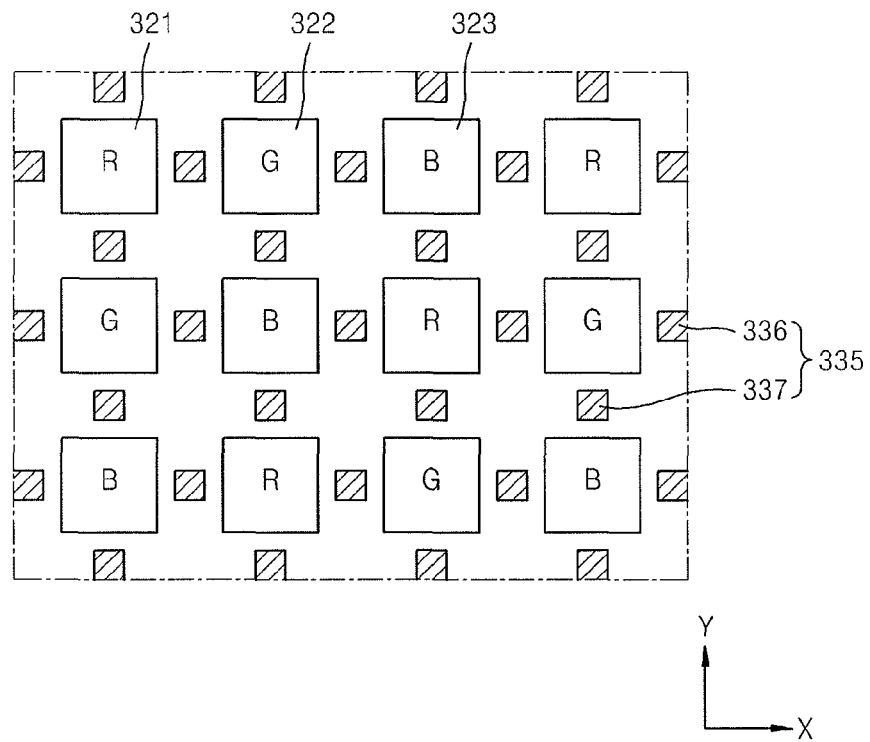

For example, as illustrated in FIG. 3I, an attachment layer 335 may be formed around or adjacent to the red, green and blue sub-pixels 321, 322, and 323. Unlike FIGS. 3G and 3H, the attachment layer 335 of FIG. 3I may be formed as individual bars or spots in at least one direction between the adjacent sub-pixels.

The attachment layer 335 may include a first attachment layer 336 centrally disposed between adjacent sub-pixels in the X-direction and a second attachment layer 337 centrally disposed between adjacent sub-pixels in the Y-direction. Accordingly, the attachment layer 335 formed on the second electrode 117 may be located between the sub-pixels at predetermined intervals.

The attachment layer may be formed as the uppermost layer of a region in which the sub-pixels are formed, and the region may be defined on the flexible substrate 101. the attachment layer may be modified in various ways. For example, the attachment layer may be formed in various patterns such as a line, a zigzag, or a wave; in various shapes such as a quadrilateral, a circle, or a polygon; and as a single line or a plurality of lines.

Referring back to FIG. 3F, the first attachment layer 141 may be any one of a metal layer, an inorganic layer, and a laser reactive layer. The first attachment layer 141 may be disposed on the uppermost portion of the region 307 in which the sub-pixel is formed. The first attachment layer 141 may be formed by using a material that is heat-bondable to a second attachment layer of a sealing film that will be described below. In other implementations, the first attachment layer 141 may be a laser induced adhesion layer that is heat-bondable by using a laser beam.

When the first attachment layer 141 is a metal layer, the first attachment layer 141 may include Mg, Mo, Ni, tungsten (W), Cu, Au, Al, Ag, or an alloy thereof. When the first attachment layer 141 is an inorganic layer, the first attachment layer 141 may include a material such as $SiO_2$ or $SiN_x$. When the first attachment layer 141 is a laser reactive layer, the first attachment layer 141 may include a material that reacts to heat generated by the laser beam, such as graphite or graphene.

The first attachment layer 141 may have a thickness ranging from, for example, about 0.01 to about 0.5 μm, such that the organic light-emitting display apparatus 100 may be thin.

According to the process described above, the plurality of thin films that include the TFT 302, the OLED 305, and the first attachment layer 141 may be formed on the flexible substrate 101.

The second electrode 117 may be used as the first attachment layer 141. In this case, the second electrode 117 need not be formed in the same manner or in the same configuration as the first attachment layer 141. Instead, the second electrode 117 may be formed on the flexible substrate 101 and on the entire area of the organic light-emitting display apparatus. The second electrode 117 may be heat-bonded by irradiating a laser beam onto a portion of the second electrode 117 around the sub-pixels.

As long as the attachment layer is the uppermost layer of the region in which the sub-pixels are formed, and the region is defined on the flexible substrate 10, the attachment layer may be formed in various ways.

Referring to FIGS. 4A to 4F and 6, stages of a process of forming the sealing film 130 of the organic light-emitting display apparatus 100 of FIG. 1 will be described below.

Figure 4A:
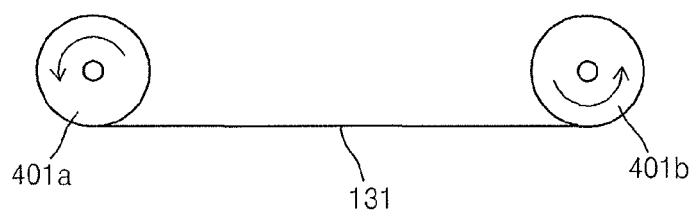
FIGS. 4A to 4F illustrate views depicting stages of a process of forming a sealing film of the organic light-emitting display apparatus of FIG. 1.

As illustrated in FIG. 4A, the base film 131 may be supplied (operation S60).

The base film 131 may be provided between a first roller 401a and a second roller 401b, and may be supplied by using a roll-to-roll method.

The base film 131 may include PEN, PET, PC, PES, transparent PI, PAR, PCO, cross-linkable epoxy, a cross-linkable urethane film, or the like. A thickness of the base film 131 may range from about 10 to about 500 μm.

The base film 131 may be cleaned by using an air blower or the like (operation S70).

The base film 131 that is cleaned may be cut in a predetermined size (operation S80).

A cut size of the base film 131 may correspond to a size of the carrier substrate 301 on which the flexible substrate 101 is formed.

Figure 4B:
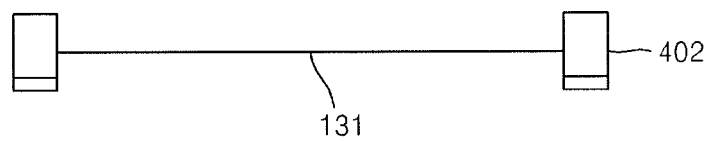

As illustrated in FIG. 4B, the base film 131 that is cut may be clamped by a film tray 402 (operation S90).

After being clamped by the film tray 402, the base film 131 may be loaded into a vacuum deposition chamber, and then, a heat treatment process may be performed on the base film 131 so as to execute an out-gassing process (operation S100).

A preprocessing process may be performed by executing the heat treatment process at about 50° C. to about 130° C. for about 10 seconds to about 10 minutes.

Figure 4C:
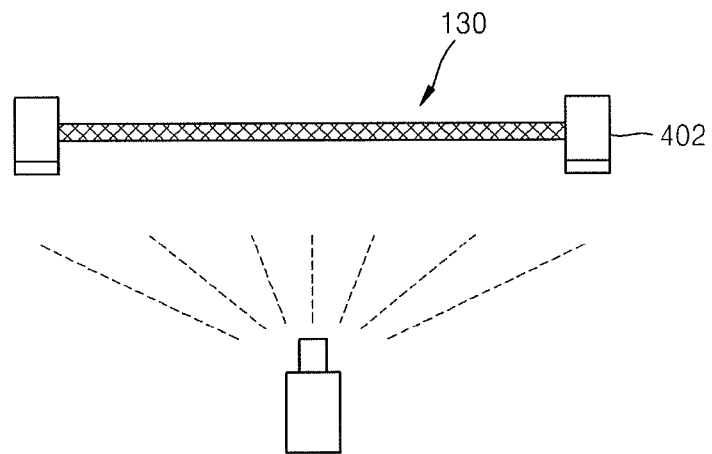

As illustrated in FIG. 4C, the sealing film 130 may be formed by depositing at least one inorganic layer and at least one organic layer on a surface of the base film 131 (operation S110).

According to the present embodiment, as illustrated in FIG. 1, the sealing film 130 may include at least one inorganic layer including the first, second, and third inorganic layers 132, 133, and 134 and at least one organic layer including the first and second organic layers 135 and 136.

The first, second, and third inorganic layers 132, 133, and 134 may include $SiO_2$, $SiN_x$, $Al_2O_3$, $TiO_2$, $ZrO_x$, ZnO, or the like.

The first inorganic layer 135 or the second inorganic layer 136 may include epoxy, PI, PET, PC, polyethylene, polyacrylate, or the like.

Figure 4D:
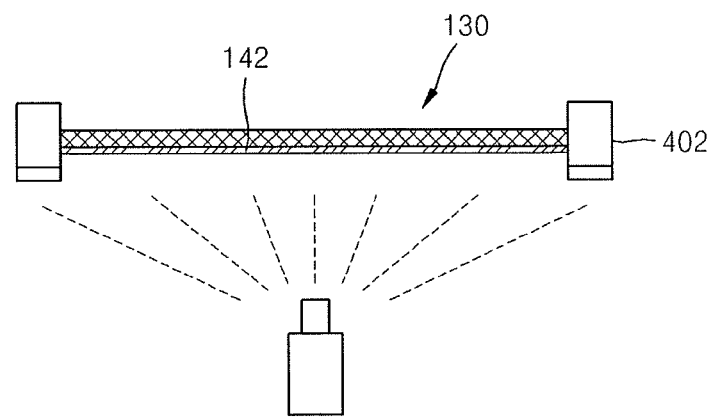

As illustrated in FIG. 4D, the second attachment layer 142 may be formed on a surface of the sealing film 130 (operation S120).

The second attachment layer 142 may be formed on the entire area of the sealing film 130. A thickness of the second attachment layer 142 may range from about 0.01 to about 0.5 µm.

The second attachment layer 142 may be any one of a metal layer, an inorganic layer, or a laser reactive layer. For example, the second attachment layer 142 may be formed using the same material as the first attachment layer 141. When the second attachment layer 142 is an inorganic layer, an inorganic layer that is used as the outermost layer of the sealing film 130 may be a second attachment layer.

The second attachment layer 142 may include a heat-bondable material, specifically, a material that is heat-bondable using a laser beam.

Figure 4E:
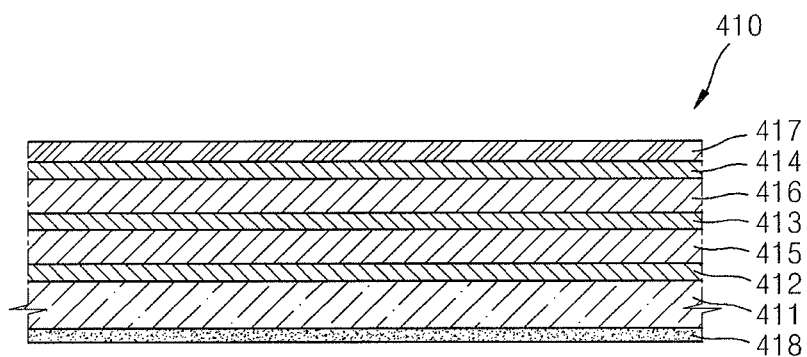

The sealing film 130 may include various functional layers. For example, as illustrated in FIG. 4E, a sealing film 410 may include a base film 411, at least one layer of an inorganic layer that is stacked on a surface of the base film 411 and includes a first inorganic layer 412, a second inorganic layer 413, and a third inorganic layer 414, and at least one layer of an organic layer that includes a first organic layer 415 and a second organic layer 416.

An attachment layer 417, formed of a heat-bondable material, may be formed on the third inorganic layer 414, that is, on the outermost layer of the sealing film 410. A protection film 418 for protecting the sealing film 410 during the manufacturing process may be formed as the opposite outer surface of the base film 411.

Figure 4F:
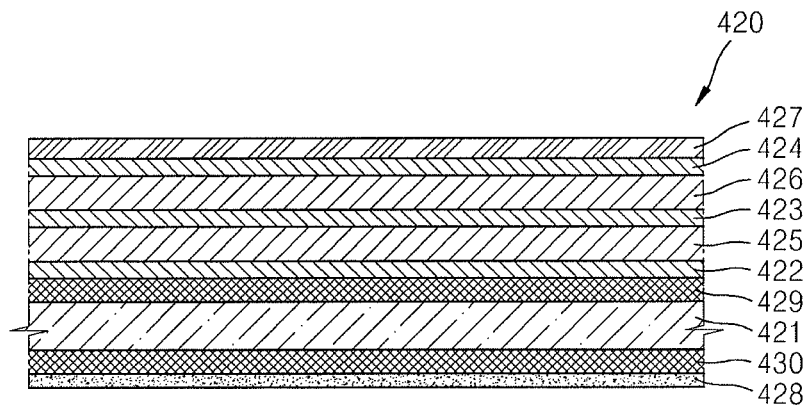

As illustrated in FIG. 4F, a sealing film 420 may include a base film 421, at least one layer of an inorganic layer that is stacked on a surface of the base film 421 and includes a first inorganic layer 422, a second inorganic layer 423, and a third inorganic layer 424; and at least one layer of an organic layer that includes a first organic layer 425 and a second organic layer 426.

An attachment layer 427, formed of a heat-bondable material, may be formed on the third inorganic layer 424, that is, the outermost layer of the sealing film 420. A protection film 428 for protecting the sealing film 420 during the manufacturing process may be formed as the opposite outer surface of the base film 421.

In addition, a first functional layer 429 may be formed between the base film 421 and the first inorganic layer 422, and a second functional layer 430 may be formed between the base film 421 and the protection film 420. The first and second functional layers 429 and 430 may form thin films having various functions such as a polarization, or a touch screen capability, depending on a purpose of a display apparatus.

As in the process described above, the plurality of thin films may be formed on the base film 421 by forming a deposition layer in which a plurality of inorganic layers and organic layers are alternately stacked, and the second attachment layer 142 that is formed on the deposition layer.

Referring to FIGS. 5A to 5D and 6, a stages of a process of attaching the flexible substrate 101 and the sealing film 130 will be described below.

Figure 5A:
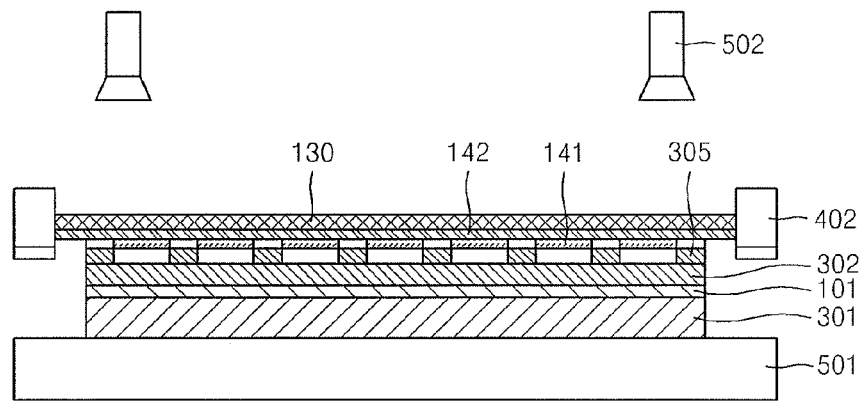
FIGS. 5A to 5D illustrate views depicting stages of a process of attaching the flexible substrate and the sealing film.
Figure 6:
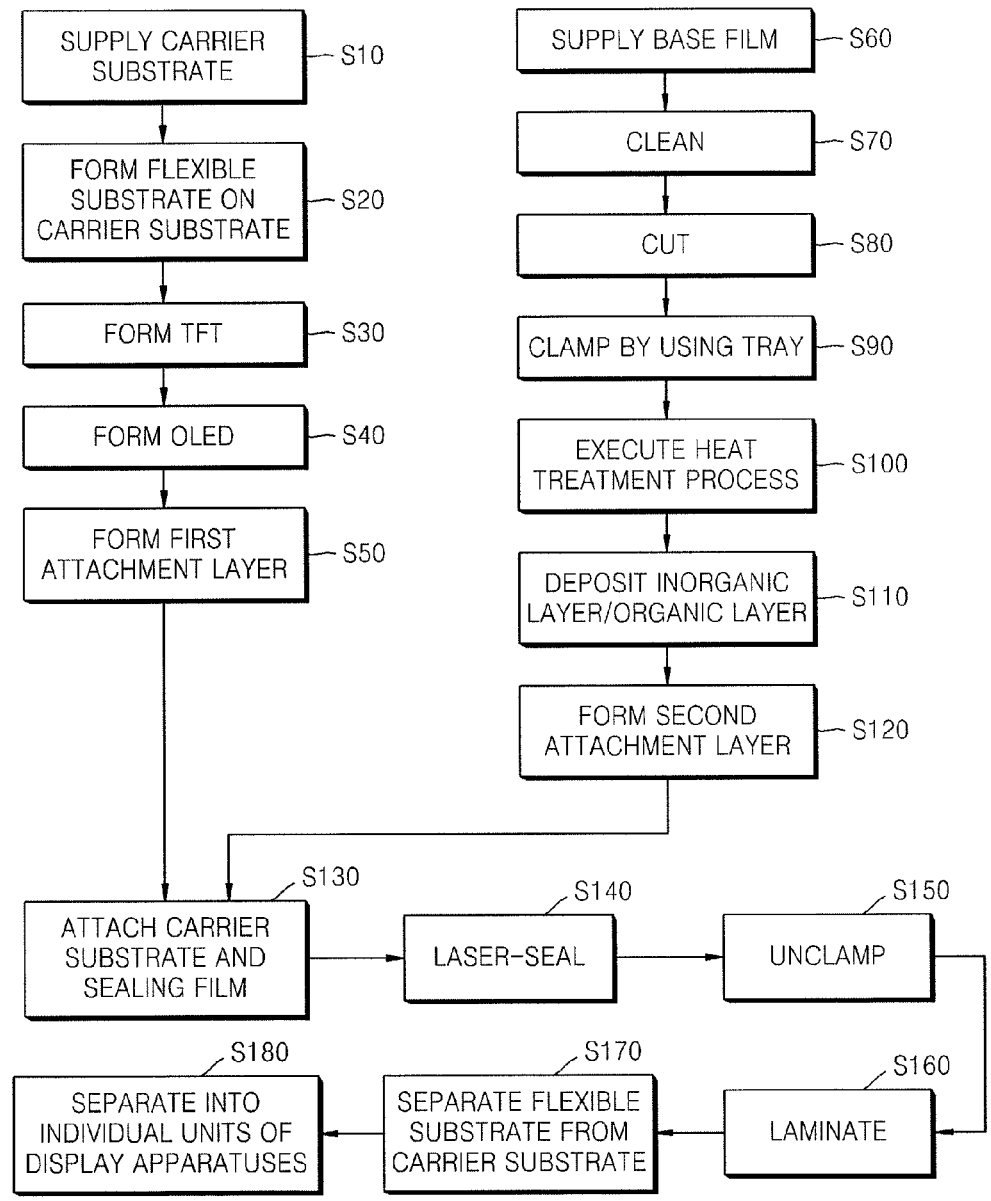
FIG. 6 illustrates a flowchart depicting a process of manufacturing the organic light-emitting display apparatus of FIG. 1.

As illustrated in FIG. 5A, the carrier substrate 301 and the sealing film 130 may be attached (operation S130).

The carrier substrate 301 may be provided on a substrate stage 501. The flexible substrate 101, the TFT 302, the OLED 305, and the first attachment layer 141 may be located on the carrier substrate 301.

The sealing film 130 may be disposed on the first attachment layer 141. The sealing film 130 may be attached such that the second attachment layer 142 faces the first attachment layer 141.

Respective positions of the carrier substrate 301 and the sealing film 130 may be arrayed by using an aligning camera 502 that is disposed to be spaced apart from an upper portion of the sealing film 130.

Figure 5B:
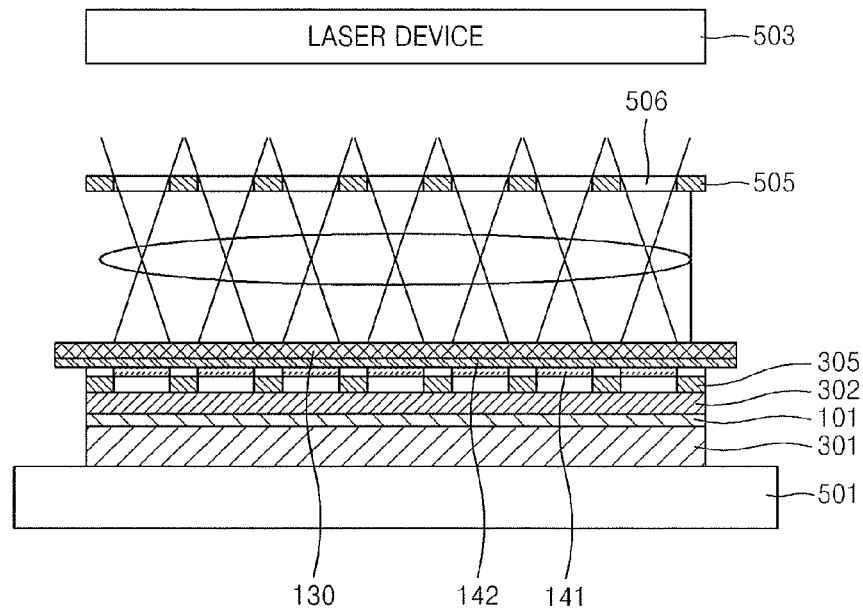

As illustrated in FIG. 5B, the first and second attachment layers 141 and 142 may be laser-sealed at a predetermined position (operation S140).

After a laser device 503, disposed to be spaced apart from the sealing film 130, is aligned, the laser device 503 may irradiate a laser beam. In this case, a pattern mask 505 having an opening 506, which is patterned, may be provided between the sealing film 130 and the laser device 503. The laser device 503 may be a semiconductor laser, an excimer laser, or the like.

The laser beam may pass through the opening 506 that is formed in the pattern mask 505 and may be irradiated onto a portion where the first and second attachment layers 141 and 142 are attached. Due to heat energy generated by the laser beam, the portion in which the first and second attachment layers 141 and 142 are attached may be securely heat-bonded.

The portion in which the first and second attachment layers 141 and 142 are attached may be formed to have various shapes and patterns. A path of the laser beam that is irradiated by the laser device 503 or a pattern of the pattern mask 505 may be formed in various ways to correspond to the various shapes and patterns of the first and second attachment layers 141 and 142.

The sealing film 130 (operation S150) may be unclamped from the film tray 402 such that the sealing film 130 is separated from the film tray 402.

Figure 5C:
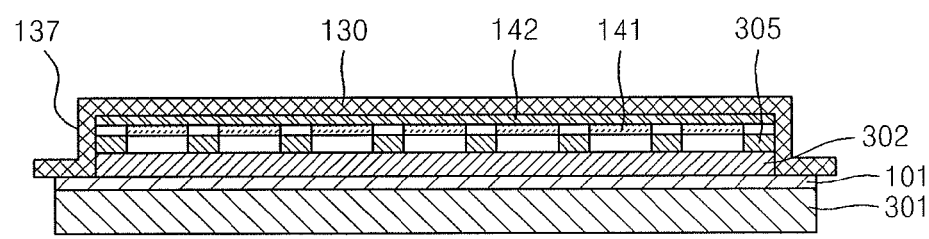

As illustrated in FIG. 5C, a lamination process may be executed (operation S160).

The flexible substrate 101 and the sealing film 130, which are attached by heat-bonding the first and second attachment layers 141 and 142, may be ventilated in a vacuum atmosphere, and may be thus vacuum-laminated. Accordingly, the flexible substrate 101 and the sealing film 130 may be attached to each other without having a space therebetween. When vacuum-laminating, an edge 137 of the sealing film 130 may be bent toward the carrier substrate 301 due to vacuum pressure.

Figure 5D:
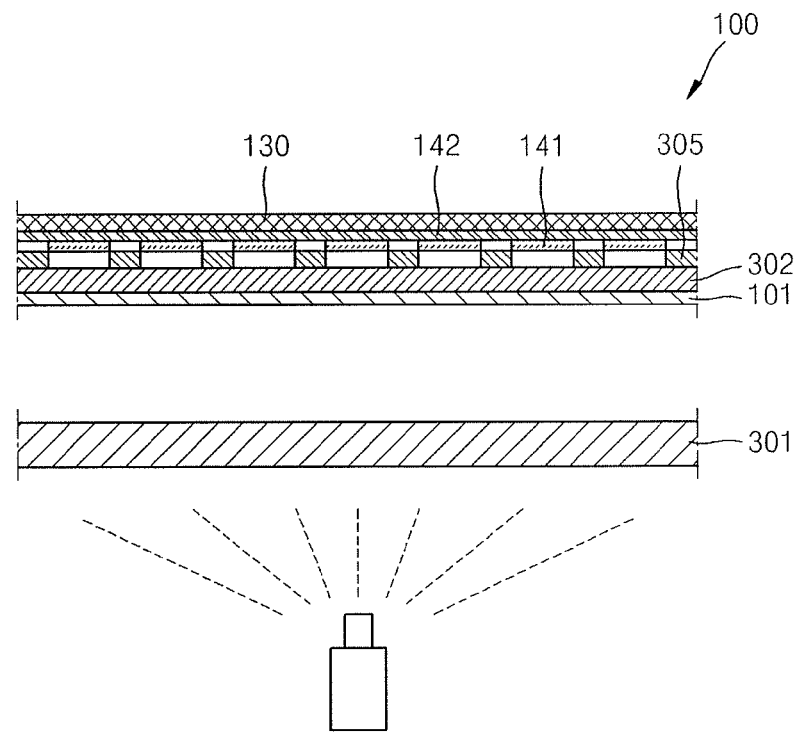

As illustrated in FIG. 5D, the flexible substrate 101 may be separated from the carrier substrate 301 (operation S170).

A laser beam may be irradiated to a lower portion of the carrier substrate 301. A dehydrogenation process is executed between the carrier substrate 301 and the flexible substrate 101, and the carrier substrate 301 and the flexible substrate 101 may be detached. In other implementations, a heating plate may be used to separate the carrier substrate 301 and the flexible substrate 101. When the flexible substrate 101 is separated from the carrier substrate 301, the organic light-emitting display apparatus 100 is manufactured.

During the manufacturing process, a plurality of organic light-emitting display apparatuses 100 may be simultaneously formed on the carrier substrate 301. Then, the plurality of organic light-emitting display apparatuses 100 may be separated into individual units (operation S180).

To do so, a cutting wheel, a laser cutter, or the like may be used to cut along cutting lines on non-display regions between the individual units of organic light-emitting display apparatuses 100. Thus, the plurality of organic light-emitting display apparatuses 100 may be separated into the individual units.

Figure 7A:
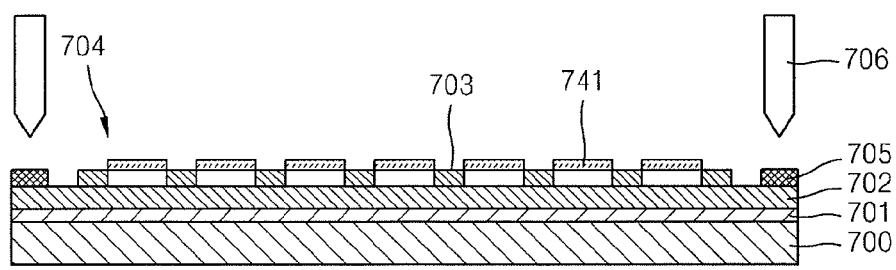
FIGS. 7A to 7C illustrate views depicting a modified example of stages of a process of manufacturing the organic light-emitting display apparatus of FIG. 1.
Figure 7B:
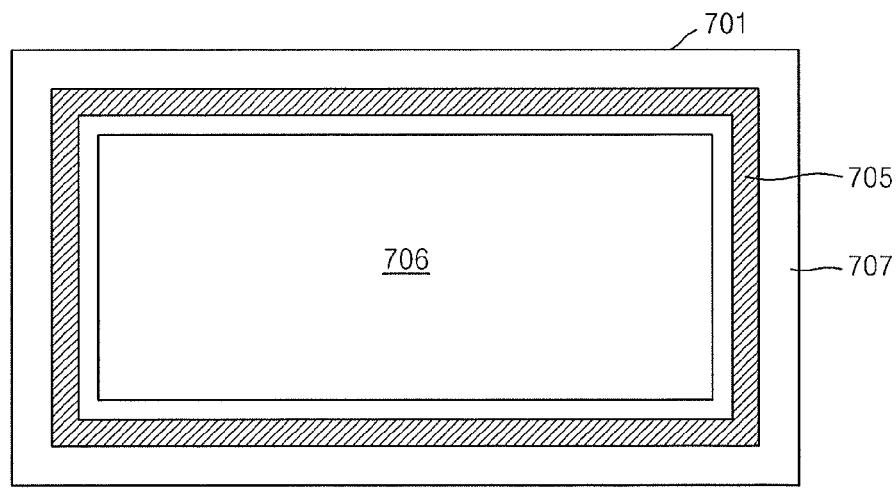
Figure 7C:
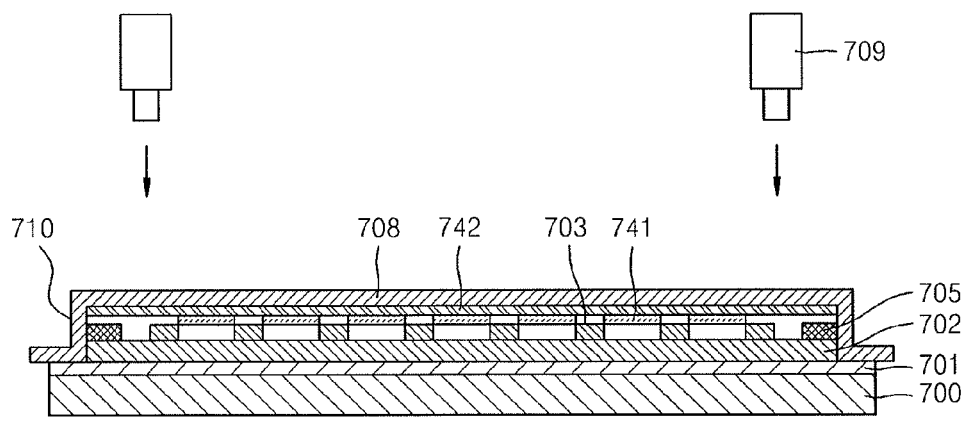
Figure 8:
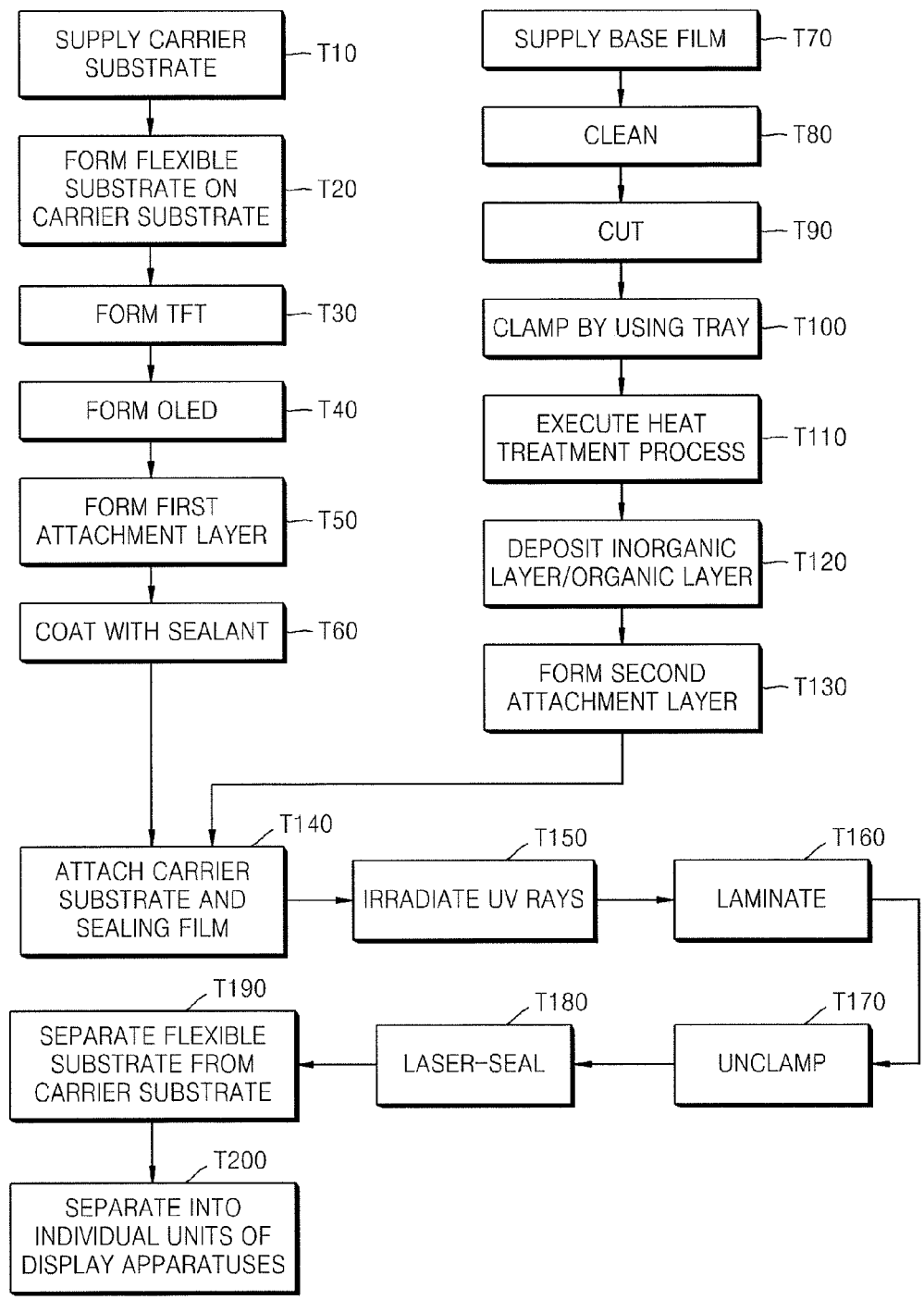
FIG. 8 illustrates a flowchart depicting a modified example of a process of manufacturing the organic light-emitting display apparatus of FIG. 1.

FIGS. 7A to 7C illustrate views depicting a modified example of stages of a process of manufacturing the organic light-emitting display apparatus 100 of FIG. 1. FIG. 8 illustrates a flowchart depicting a modified example of a process of manufacturing the organic light-emitting display apparatus 100 of FIG. 1.

The features of the present embodiment that are the same as the above-described process of manufacturing the organic light-emitting display apparatus 100 will not be repeatedly described, and only the main features of the present embodiment will be described.

A carrier substrate 700 may be supplied (operation T10), and a flexible substrate 701 may be formed on the carrier substrate 301 (operation T20).

The flexible substrate 701 may have a size in which the plurality of individual units of the organic light-emitting display apparatus 100 are formed on the carrier substrate 301.

A TFT 702 is formed on the flexible substrate 701 (operation T30).

As illustrated in FIG. 1, the TFT 702 may include a plurality of thin films that are stacked on the flexible substrate 701.

An OLED 703 may be formed on the TFT 702 (operation T40).

A first attachment layer 741 may be formed on the OLED 703 (operation T50).

The first attachment layer 741 may be formed as the uppermost layer of a region 704 in which the sub-pixels are formed. The region 704 may be defined on the flexible substrate 701. According to the present embodiment, the first attachment layer 741 may be formed on an upper portion of the OLED 703. In other implementations, the uppermost electrode of the OLED 703, that is, a common electrode which is a second electrode, may be used as the first attachment layer 741.

The first attachment layer 741 may be formed as a line that continues in at least one direction around the sub-pixel, or as individual bars, in at least one direction around the sub-pixel, as examples.

The first attachment layer 741 may be any one of a metal layer, an inorganic layer, or a laser reactive layer. The first attachment layer 741 may be formed using a material that is be heat-bondable by using a laser beam.

As illustrated in FIG. 7A, a sealant 705 may be coated at an edge of the flexible substrate 701 (operation T60).

The sealant 705 may be coated on the flexible substrate 701 by using a dispenser 706. The sealant 705 may be an ultraviolet (UV) sealant that may undergo UV curing.

As illustrated in FIG. 7B, the sealant 705 may be formed in a non-display region 707 of the flexible substrate 701, which extends along an outer side of a display region 706. The sealant 705 may be formed along an outer edge of the flexible substrate 701 at a predetermined thickness.

A process of forming a sealing film 708 that is attached on the flexible substrate 701 is described below.

A base film may be supplied (operation T70). The base film may be supplied by using a roll-to-roll method.

The base film may be cleaned by using an air blower or the like (operation T80). The base film that is cleaned may be cut to have a predetermined size (operation T90). A cut size of the base film may correspond to a size of the carrier substrate 700 on which the flexible substrate 101 is formed.

The base film that is cut may be clamped by a film tray (operation T100).

After being clamped by the film tray, the base film 131 may be loaded in a vacuum deposition chamber, and then, a heat treatment process may be performed on the base film 131 so as to execute an out-gassing process (operation T110).

The sealing film 708 may be formed by depositing at least one inorganic layer and at least one organic layer on a surface of the base film (operation T120).

A second attachment layer 742 may be formed on a surface of the sealing film 708 (operation T130).

The second attachment layer 742 may be formed on the entire area of the sealing film 708. The second attachment layer 742 may be formed by using the same material as the first attachment layer 741, as an example. When the second attachment layer 742 is an inorganic layer, an inorganic layer that is used as the outermost layer of the sealing film 708 may be the attachment layer 742.

Hereinafter, a process of attaching the flexible substrate 701 and the sealing film 708 will be described.

The carrier substrate 700 and the sealing film 708 may be attached (operation T140).

As illustrated in FIG. 7C, the flexible substrate 701, the TFT 702, an OLED 703, and the first attachment layer 741 may be formed on the carrier substrate 700. The sealing film 708 may be disposed on the first attachment layer 741. The sealing film 708 may be attached such that the second attachment layer 742 faces the first attachment layer 741.

A UV irradiation device 709 may irradiate UV rays to the sealant 705 that surrounds the outer periphery of the flexible substrate 701 (operation T150) such that the sealant 705 undergoes UV curing.

The lamination process may be executed on the flexible substrate 701 and the sealing film 708 that are attached to each other by using the sealant 705 (operation T160).

The flexible substrate 701 and the sealing film 708 may be ventilated in a vacuum atmosphere and thus may be vacuum laminated. Accordingly, the flexible substrate 701 and the sealing film 708 may be attached to each other without any space therebetween. As illustrated in FIG. 7C, when vacuum laminating is carried out, an edge 710 of the sealing film 708 may be bent toward the carrier substrate 700 due to vacuum pressure.

The sealing film 708 (operation T170) may be unclamped from the film tray. The first and second attachment layers 741 and 742 may be laser-sealed at a predetermined position (operation T180). The laser beam may be irradiated onto a portion in which the first and second attachment layers 741 and 742 are attached. Due to heat energy generated by the laser beam, the portion in which the first and second attachment layers 741 and 742 are attached may be securely heat-bonded.

The flexible substrate 701 may be separated from the carrier substrate 700 (operation T190).

A process of detaching the carrier substrate 700 and the flexible substrate 701 may be conducted by using a laser device or a heating plate, or by executing a dehydrogenation process. The flexible substrate 701 is separated from the carrier substrate 700, and thus the organic light-emitting display apparatus 100 may be manufactured.

During the manufacturing process, a plurality of organic light-emitting display apparatuses 100 may be simultaneously formed on the carrier substrate 700. Then, the plurality of organic light-emitting display apparatuses 100 may be separated into individual units. (operation T200)

According to the present embodiment, the first and second attachment layers 741 and 742, which are heat-bonded around the sub-pixel, and also the sealant 705 provided along the edge of the flexible substrate 701 may block external oxygen or moisture.

Figure 9:
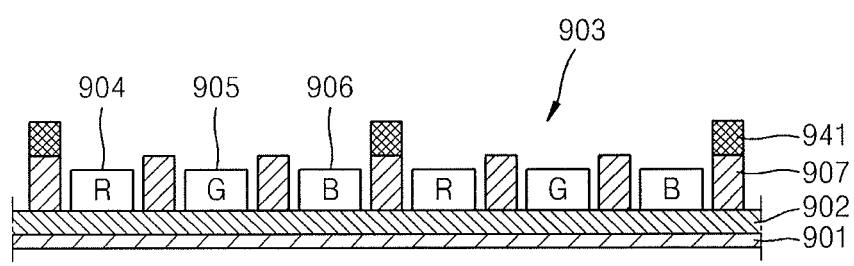
FIG. 9 illustrates a cross-sectional view depicting an attachment layer structure according to another embodiment.

FIG. 9 illustrates a cross-sectional view depicting an attachment layer structure according to another embodiment.

Referring to FIG. 9, a TFT 902 may be formed on the flexible substrate 901. As illustrated in FIG. 1, the TFT 902 may include a plurality of thin films that are stacked on the flexible substrate 901.

An OLED 903 may be formed on the TFT 902. The OLED 903 may include a red EML 904, a green EML 905, and a blue EML 906 that are formed in sub-pixels.

A plurality of spacers 907 may be formed on the TFT between each of the sub-pixels. The spacers 907 may be formed as a protrusion structure by patterning the PDL 114 that defines each sub-pixel, or by using a separate material so that the spacers 907 are formed around the sub-pixels, as examples.

An attachment layer 941 may be formed on the spacers 907. The attachment layer 941 may be formed as the uppermost layer of a region in which the sub-pixels are formed. The region may be defined on the flexible substrate 901. The attachment layer 941 may be any one of a metal layer, an inorganic layer, or a laser reactive layer, or may be formed of a material that is heat-bondable by using a laser beam. When the attachment layer 941 is an inorganic layer, the inorganic layer may be used as an attachment layer by adjusting respective heights of the spacers 907.

The attachment layer 941 may be formed on each of the sub-pixels, or the plurality of sub-pixels may be set as a group, and the attachment layer 941 may be formed between each group. For example, the red, green, and blue EMLs 904, 905, and 906 may be set as a group, and the attachment layer 941 may be formed on each group. The attachment layer 941 may be modified in various ways.

A sealing film, which includes another attachment layer that is heat-bondble with the attachment layer 941, may be attached on the flexible substrate 901.

By way of summation and review, research into developing slimmer display apparatuses has been conducted. Among the developed display apparatuses, flexible display apparatuses, which are easily portable and may be applied to devices of various shapes, are being regarded as a next-generation display apparatus. Among the flexible display apparatuses, a flexible display apparatus that is based on organic light-emitting display technology is highly regarded highly.

In a flexible display apparatus, it is desirable to block external oxygen ($O_2$), moisture ($H_2O$), and the like from penetrating into the flexible display apparatus. Also, it is desirable to reduce voids that may be generated during a manufacturing process.

Embodiments provide a flexible display apparatus that includes an attachment layer structure on respective surfaces of a flexible substrate and a sealing film that face each other. Thus, external oxygen or moisture may be prevented from penetrating into the flexible display apparatus. A manufacturing method of the flexible display apparatus is also provided.

By removing voids that are generated in the flexible display apparatus, an adhesion strength between an organic material and a sealing film may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing a flexible display apparatus, the method comprising:
sequentially forming a flexible substrate, a thin film transistor (TFT), an organic light-emitting diode (OLED) including a first electrode, an intermediate layer, and a second electrode, and a first attachment layer on a carrier substrate;
sequentially forming a deposition layer and a second attachment layer on a sealing film;
attaching the carrier substrate and the sealing film to each other such that the sealing film covers flexible substrate on the carrier substrate;
sealing the first and second attachment layers;
laminating the carrier substrate and the sealing film; and
separating the sealing film and the flexible substrate from the carrier substrate.

2. The method as claimed in claim 1, wherein forming the first attachment layer includes forming the first attachment layer as an uppermost layer of a sub-pixel that is defined on the flexible substrate.

3. The method as claimed in claim 2, wherein the first attachment layer is formed on the second electrode and around the sub-pixel.

4. The method as claimed in claim 3, wherein the first attachment layer is formed in a shape of a line that continues in at least one direction around the sub-pixel.

5. The method as claimed in claim 4, wherein the first attachment layer is formed to surround the sub-pixel.

6. The method as claimed in claim 4, wherein:
a plurality of sub-pixels are grouped on the substrate, and the first attachment layer is formed between each group.

7. The method as claimed in claim 3, wherein the first attachment layer is formed as an individual bar in at least one direction around the sub-pixel.

8. The method as claimed in claim 2, wherein:
the second electrode is formed in an entire area of the flexible substrate, and
the first attachment layer includes the second electrode.

9. The method as claimed in claim 1, wherein the second attachment layer is formed in an entire area of the deposition layer.

10. The method as claimed in claim 1, wherein sealing the first and second attachment layers includes laser-sealing and heat-bonding the first and second attachment layers at a predetermined position.

11. The method as claimed in claim 1, wherein separating the sealing film and the flexible substrate from the carrier substrate includes irradiating a laser beam from an outside of the carrier substrate, such that a structure including the flexible substrate, the TFT, the OLED including the first electrode, the intermediate layer, and the second electrode, and the first attachment layer is separated from the carrier substrate.

12. The method as claimed in claim 1, wherein:
the flexible substrate is a flexible mother substrate having a size in which a plurality of individual display apparatus units are formed, the TFT and the OLED are formed on each of separate regions of the flexible substrate, and after separating the sealing film from the carrier substrate, cutting the flexible substrate into the plurality of individual display apparatus units.

13. The method as claimed in claim 1, further including spreading an ultraviolet (UV) sealant along an edge of the flexible substrate, and curing the ultraviolet (UV) sealant.

* * * * *